(12) United States Patent
Nakazawa et al.

(10) Patent No.: US 9,127,355 B2
(45) Date of Patent: Sep. 8, 2015

(54) SUBSTRATE PROCESSING APPARATUS

(71) Applicant: Canon Anelva Corporation, Kawasaki-shi (JP)

(72) Inventors: Toshikazu Nakazawa, Kawasaki (JP); Norihito Tsukamoto, Kawasaki (JP); Keisuke Ueda, Kawasaki (JP); Eiji Ozaki, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 152 days.

(21) Appl. No.: 13/693,209

(22) Filed: Dec. 4, 2012

(65) Prior Publication Data
US 2013/0161187 A1   Jun. 27, 2013

(30) Foreign Application Priority Data

Dec. 22, 2011   (JP) .................................. 2011-281014

(51) Int. Cl.
*H01J 37/34* (2006.01)
*C23C 14/34* (2006.01)
*H01J 37/32* (2006.01)

(52) U.S. Cl.
CPC ......... *C23C 14/345* (2013.01); *H01J 37/32651* (2013.01); *H01J 37/34* (2013.01)

(58) Field of Classification Search
CPC ............ H01J 37/32651; H01J 37/3438; H01J 37/3441; H01J 37/3447
USPC .......................... 204/298.11, 298.14; 118/720
See application file for complete search history.

(56) References Cited

U.S. PATENT DOCUMENTS

| | | | |
|---|---|---|---|
| 2002/0029960 A1* | 3/2002 | Morimoto et al. | ........ 204/192.12 |
| 2004/0251130 A1* | 12/2004 | Liu et al. | ................... 204/298.01 |
| 2010/0147680 A1* | 6/2010 | Li et al. | ................... 204/298.08 |
| 2010/0252417 A1* | 10/2010 | Allen et al. | ............... 204/192.12 |
| 2011/0155059 A1 | 6/2011 | Egami et al. | |
| 2011/0256642 A1 | 10/2011 | Matsui et al. | |
| 2012/0148375 A1 | 6/2012 | Tashiro et al. | |

FOREIGN PATENT DOCUMENTS

| | | |
|---|---|---|
| JP | 1-107542 A | 4/1989 |
| JP | 5247639 A | 9/1993 |

(Continued)

OTHER PUBLICATIONS

Office Action issued in Japanese Application No. 2011-281014 dated Jul. 10, 2015 (3 pages).

*Primary Examiner* — Rodney McDonald
(74) *Attorney, Agent, or Firm* — Fitzpatrick, Cella, Harper & Scinto

(57) ABSTRACT

Provided is a substrate processing apparatus including an openable and closable lid and being capable of precisely controlling a gap between multiple shields. The substrate processing apparatus includes: an openable and closable lid provided on an opening of a chamber; a first shield provided on a surface of the lid at the chamber side and having an insertion hole; an insertion section fixed to the lid while inserted through the insertion hole, and configured to support the first shield in a manner movable within a predetermined distance; a restriction section provided on an end portion of the insertion section and configured to restrict the movement of the first shield; and biasing means configured to bias the first shield to a member provided inside the chamber when the lid is closed.

4 Claims, 6 Drawing Sheets

(56) References Cited

FOREIGN PATENT DOCUMENTS

| JP | 2002-110649 A | 4/2002 |
| JP | 2004-76069 A | 3/2004 |
| JP | 2009181972 A | 8/2009 |

* cited by examiner

CLOSED STATE

OPENED STATE

SUBSTRATE PROCESSING APPARATUS

CROSS-REFERENCES TO RELATED APPLICATIONS

This application claims the benefit of Japanese Patent Application No. 2011-281014, filed Dec. 22, 2011. The content of the aforementioned application is incorporated herein by reference in its entirety.

TECHNICAL FIELD

The present invention relates to a substrate processing apparatus provided to an opening of a chamber.

BACKGROUND ART

Heretofore, a sputtering apparatus has been disclosed as shown in Japanese Patent Application Laid-Open No. 5-247639, in which multiple shields are provided between a target and a substrate holder for the purpose of preventing sputtering particles from adhering to an inner wall of a chamber. In such an apparatus, in order to control the pressure of a processing space partitioned by the target, the substrate holder, and the multiple shields, the conductance at a gap between the multiple shields has to be controlled by accurately positioning the multiple shields.

Meanwhile, the shields need to be replaced regularly when stained with a film adhering thereto. To facilitate this shield replacement work, an openable and closable top lid is provided to an upper portion of the apparatus in some cases. For example, Japanese Patent Application Laid-Open No. 2009-181972 discloses an MOCVD apparatus having: a gas-introducing port configured to introduce a film-forming gas into a reaction vessel; an openable and closable top lid configured to shut a top lid opening of the reaction vessel; an anti-adhesion plate (quartz plate) detachably provided on the top lid; and an elevating and rotating device configured to open or close the top lid and to adjust the angle of the top lid to a substrate.

Nevertheless, when the apparatus provided with an openable and closable top lid at its upper portion has a plasma space formed by a shield provided inside a chamber and a shield provided on the openable and closable top lid, the following problems are brought about. When the top lid of the chamber is closed in order to make the inside of the chamber airtight, a gap needs to be provided between the shield provided on the top lid and the shield provided inside the chamber. This is because that it is difficult to fabricate and machine precisely the shield provided on the top lid and the shield provided inside the chamber so that they contact each other exactly. Furthermore, they sometimes thermally expand during processing. When the top lid shield and the shield provided inside the chamber contact with each other, each shield can not thermally expand freely, so deformation and damage of the shield may be caused. On the other hand, when a large gap is designed in considering thermal expansion of the shields, sputtering particles may pass through the gap and directly adhere to an inner wall of the chamber. Hence, such a gap may work as a particle generation factor. Additionally, there is another problem that emission of a process gas to the outside of a processing space through this gap makes the internal pressure of the processing space unstable. An object of the present invention is to provide a substrate processing apparatus which allows the thermal expansion of the shields provided on the top lid of the chamber and inside the chamber, and which is enable to inhibit the sputtering particles to scatter out the processing space and stably generate a plasma inside the processing space.

SUMMARY OF INVENTION

In order to solve the above-described problems, a substrate processing apparatus comprises a chamber; an openable and closable lid provided on an opening of the chamber; a first shield provided on the lid and on the interior side of the chamber; an attachment means configured to attach the first shield to the lid; and a biasing means configured to bias the first shield to a member provided inside the chamber when the lid is closed.

The present invention makes it possible to provide a substrate processing apparatus including an openable and closable lid provided on a chamber and being configured to precisely control a gap between multiple shields, enabling formation of a stable plasma space.

DESCRIPTION OF EMBODIMENTS

Figure 1:
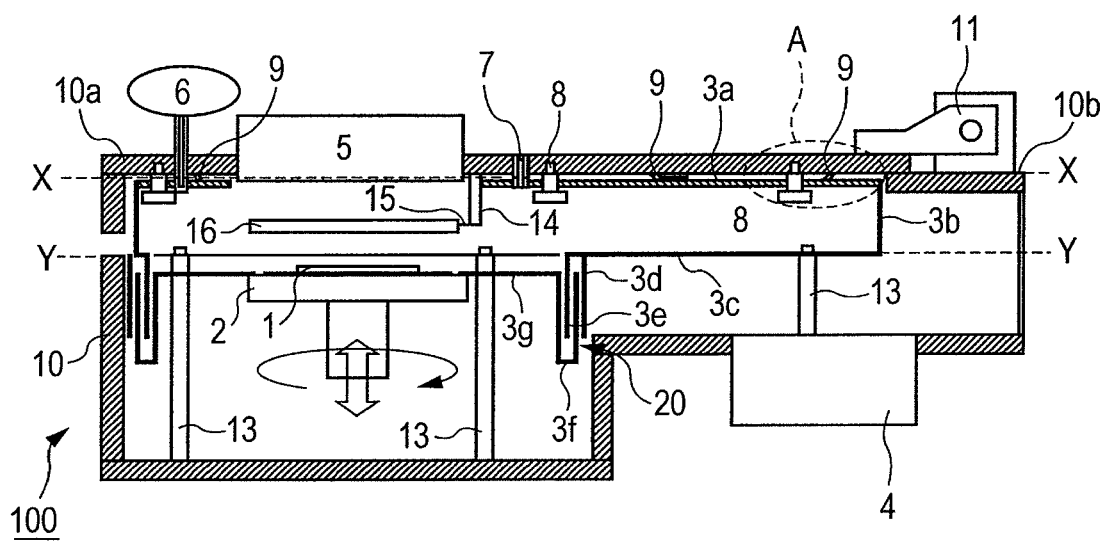
FIG. 1 is an overall schematic diagram of a substrate processing apparatus 100 according to one embodiment of the present invention.
Figure 2:
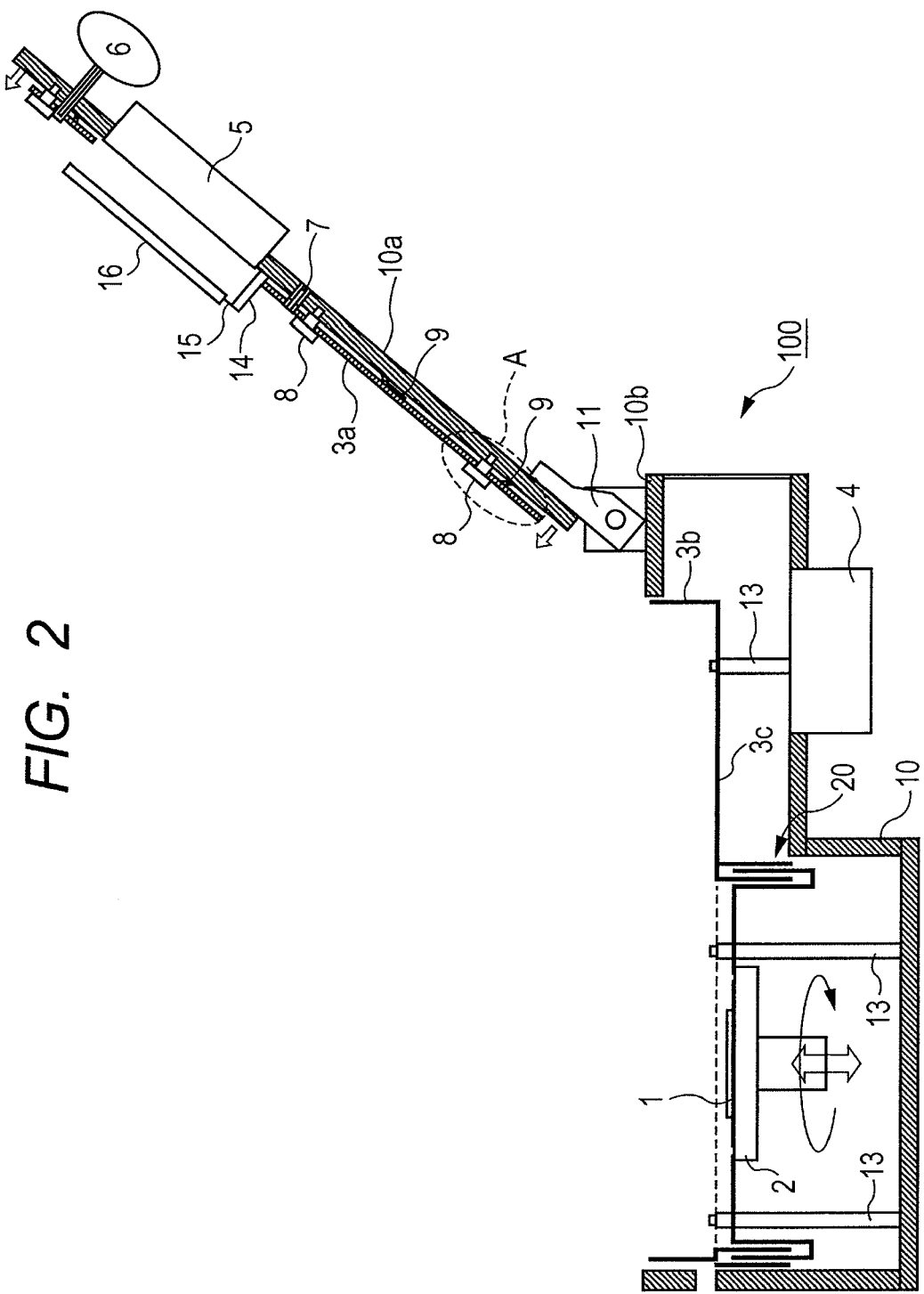
FIG. 2 is an overall schematic diagram of the substrate processing apparatus 100 according to the embodiment of the present invention.
Figure 3:
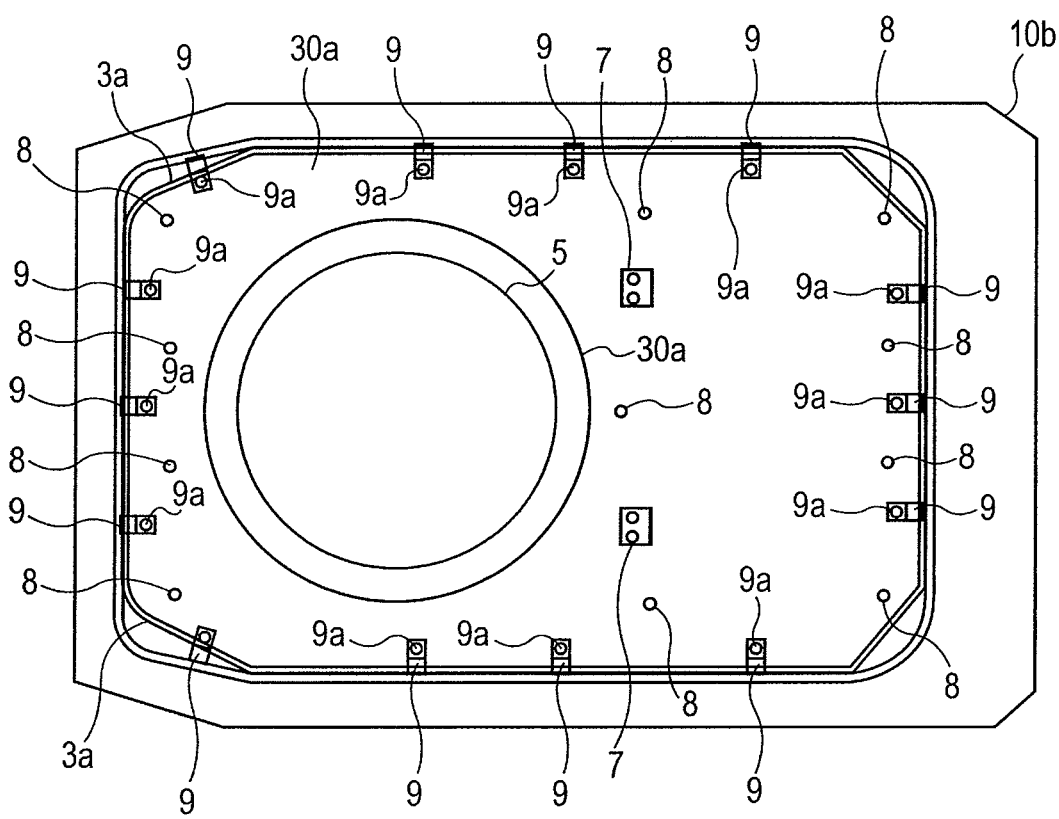
FIG. 3 is a top view of the cross section X-X in FIG. 1, seen from the above.

Hereinafter, a representative embodiment of the present invention will be described based on the accompanying drawings. FIGS. 1 and 2 are overall schematic diagrams of a substrate processing apparatus 100 according to one embodiment of the present invention. FIG. 1 shows a state where an opening of a chamber 10 is closed by a top lid 10a. FIG. 2 shows a state where the opening is opened. FIG. 3 is a top view of the cross section X-X in FIG. 1, seen from the above. In this embodiment, as an example of the substrate processing apparatus 100, description will be given of a sputtering apparatus used to produce magnetic sensors such as a read head for storage of a hard disk drive and for spintronics applications such as a non-volatile magnetoresistive random-access memory (MRAM). However, the gist of the present invention is not limited thereto. The present invention is applicable to, for example, vacuum processing systems such as a PVD system, a CVD system, and an etching system.

As shown in FIG. 1, the sputtering apparatus 100 includes: the top lid 10a capable of opening and closing the opening provided in a ceiling wall 10b of the chamber 10; a target holder 5 attached to the top lid 10a and configured to hold a target; and evacuating means 4 configured to evacuate the chamber 10 to a predetermined reduced pressure state. Further, the sputtering apparatus 100 includes a gas-introducing pipe 7 penetrating the top lid 10a to introduce a process gas such as argon. The evacuating means 4 is capable of maintaining the pressure inside the chamber 10 in a reduced pressure state of normally approximately $1\times10^{-7}$ Pa to approximately 10 Pa. To the target holder 5, unillustrated voltage-applying means is connected. By applying a DC voltage or high frequency voltage to the target holder 5, the target holder 5 functions as a cathode, which can turn a process gas into a plasma, thus sputtering the target.

The top lid 10a is provided with the target holder 5 facing a substrate holder 2. In the present embodiment, as shown in FIG. 1, a target holder 5 is a part of the top lid 10a. As shown in FIG. 2, the top lid 10a is openable by pivoting at approximately 155 degrees around a hinge part 11 provided above the ceiling wall 10b of the chamber 10. With such a configuration, regular maintenance works such as replacements of a target and a shield 3 can be performed easily. Note that in the present Example, the hinge part is provided to open and close the top lid from the viewpoint of facilitating the maintenances. However, the gist of the present invention is not limited thereto. For example, it is possible to provide an elevating mechanism configured to elevate the top lid 10a in a vertical direction.

Inside the chamber 10, the substrate holder 2 is provided, on which a substrate 1 is mounted. The substrate holder 2 is capable of moving vertically in such a manner as to approach the target holder 5, and configured to be rotatable around a rotation axis perpendicular to a substrate-mounting surface of the substrate holder 2. Above the substrate-mounting surface of the substrate holder 2, a shutter 16 is provided, which is configured to shield a target surface. The shutter 16 is connected to a shutter opening and closing driver 14 with an arm 15, so that the shutter 16 can move for opening and closing between a retreating position at which the target surface is exposed and a shielding position at which the target surface is shielded. The shutter opening and closing driver 14 is fixed to the top lid 10a.

Between the target holder 5 and the substrate holder 2, multiple shields 3 configured to prevent a film from adhering to an inner wall of the chamber 10 form a space (hereinafter, processing space) where a plasma is generated for processing. Note that in the present Example, the retreating position of the shutter 16 is compartmented by the multiple shields 3b, 3c and 3a, and the retreating position of the shutter 16 is also a part of the processing space. The shields 3 are made of stainless steel or the like, and are configured to be detachable with screws or the like inside the chamber 10 in such a manner as to be replaceable regularly. In order to introduce a process gas such as argon into this plasma space, the gas-introducing pipe 7 is provided and penetrating the top lid 10a and a ceiling shield 3a. Moreover, a pressure gauge 6 is provided to measure the pressure of the plasma space.

As shown in FIG. 2, the ceiling shield 3a is attached on the top lid 10a while being supported by fixation bolts 8. As shown in FIG. 3, the ceiling shield 3a is provided with multiple insertion holes configured to insert the fixation bolts 8 therein. Moreover, an insertion hole configured to insert the fixation bolt 8 therein is provided in a central portion of the ceiling shield 3a to prevent the ceiling shield 3a from flexing at the central portion.

Figure 4A:
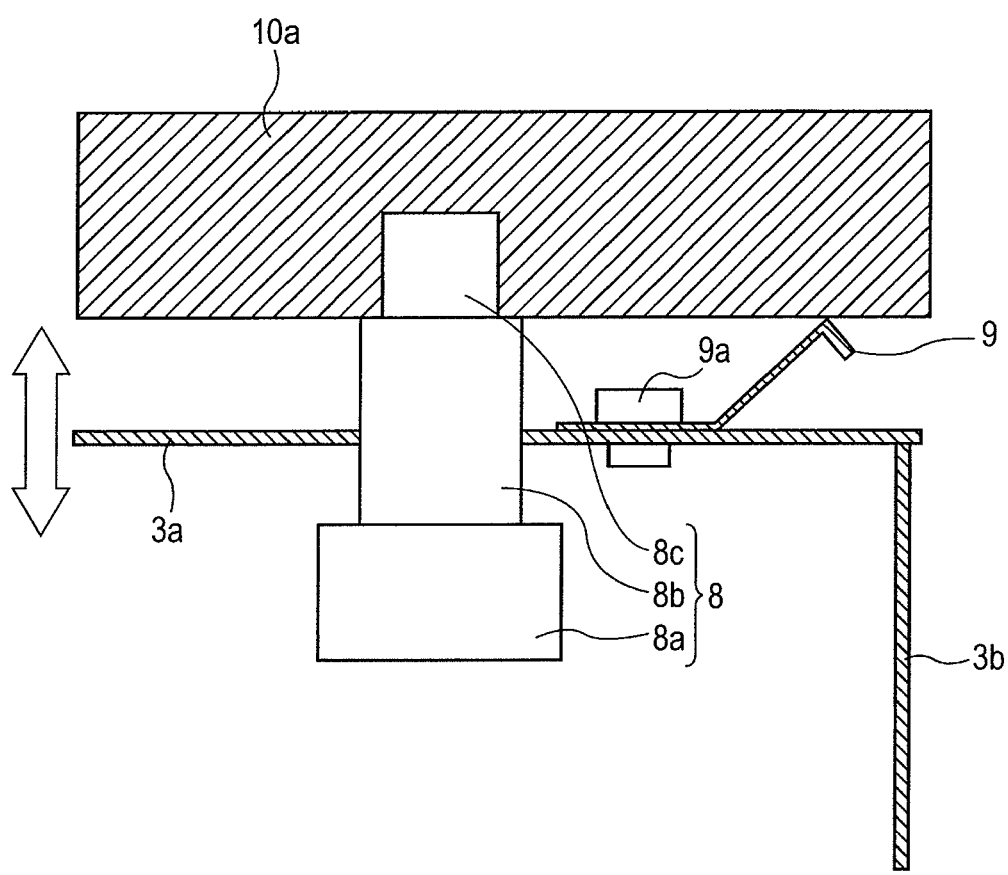
FIG. 4A is an enlarged view of a portion A in FIG. 1.
Figure 4B:
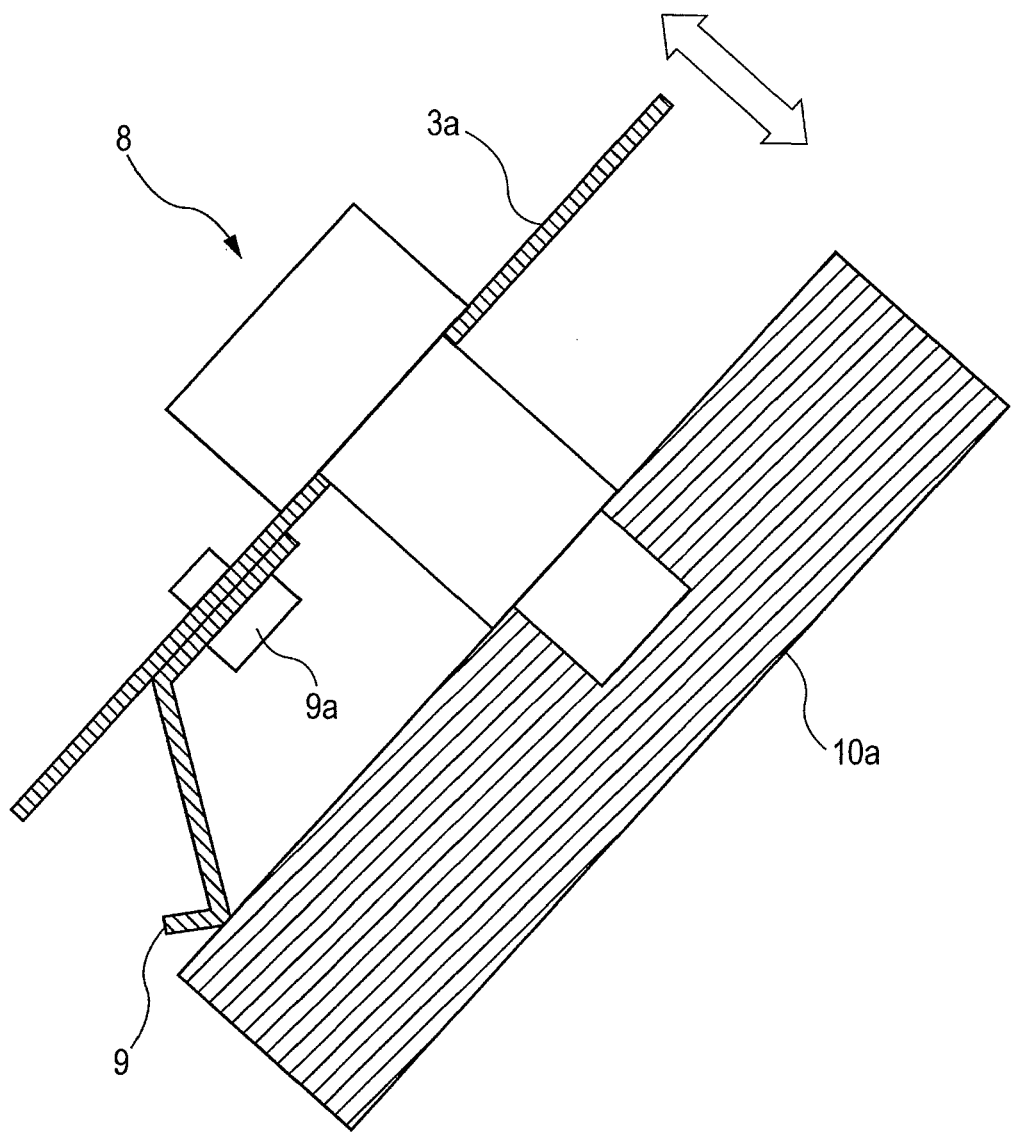
FIG. 4B is an enlarged view of the portion A in FIG. 2.

As shown in FIGS. 4A and 4B, the fixation bolt 8 is inserted through the insertion hole of the ceiling shield 3a and fixed to the top lid 10a, so that the ceiling shield 3a is movable within a predetermined distance (1 to 10 mm) in arrow directions. Specifically, the fixation bolts 8 includes: a screw section 8c fastened by being screwed into a screw hole provided in the top lid 10a; a columnar insertion section 8b inserted through the insertion hole; and a restriction section 8a configured to restrict movement of the ceiling shield 3a. Since the restriction section 8a is a disk-shaped member larger than the insertion hole of the ceiling shield 3a, the restriction section 8a is capable of restricting movement of the ceiling shield 3a. By unfastening the screw section 8c and detaching the fixation bolt 8 from the top lid 10a, the ceiling shield 3a stained with a film adhering thereto can be replaced with a new ceiling shield.

Also, the insertion section 8b functions to position the ceiling shield 3a. The insertion section 8b is configured to have almost the same radius as the insertion hole formed on the ceiling shield 3a to prevent the ceiling shield 3a to be off the correct position by opening and closing the top lid 10a.

Note that in the present Example, the screw section 8c is provided to fix the fixation bolt 8 to the top lid 10a. However, the gist of the present invention is not limited thereto. Instead of providing the screw section 8c, an upper surface of the insertion section 8b may be directly fixed to the top lid 10a by welding, press-fitting, or the like. In this case, the restriction section 8a should be configured to be detachable from an end portion of the insertion section 8b by screw fastening or the like in such a manner that the ceiling shield 3a is detachable and replaceable.

As shown in FIGS. 4A and 4B, biasing means 9 is provided between the ceiling shield 3a and the top lid 10a. The biasing means 9 is an elastic member such as a leaf spring or a coil spring, and is capable of biasing the ceiling shield 3a toward the restriction section 8a of the fixation bolt 8. The leaf spring as the biasing means 9 is fixed to the ceiling shield 3a with a screw 9a. Further, as shown in FIG. 3, multiple leaf springs 9 are provided along an outer edge portion of the ceiling shield 3a.

FIG. 4A is an enlarged view of a portion A shown in FIG. 1, showing a state of the biasing means 9 when the top lid 10a is closed. When the biasing means 9 being contracted biases the ceiling shield 3a as in this state, the ceiling shield 3a can be pushed against an upper end portion of a side wall shield 3b with no gap therebetween. In other words, when the top lid 10a is closed, the ceiling shield 3a rises from the restriction section 8a toward the top lid 10a, and is supported by the upper end portion of the side wall shield 3b. Note that, as shown in FIG. 1, the side wall shield 3b has a cylindrical shape. Accordingly, the ceiling shield 3a is biased to the annular upper end portion of the side wall shield 3b. An annular lower end portion of the side wall shield 3b is fixed to a bottom shield 3c.

FIG. 4B is an enlarged view of the portion A in FIG. 2, showing a state of the biasing means 9 when the top lid 10a is opened as shown in FIG. 2. When the top lid 10a is opened as in this state, the biasing means 9 pushes the ceiling shield 3a down to the restriction section 8a of the fixation bolt 8. Note that in the present Example, the side wall shield 3b corresponds to a second shield in the claims. Alternatively, the side wall shield 3b, the bottom shield 3c, a shield 3d, a shield 3e, and a substrate-surrounding shield 3g may collectively form the second shield. The side wall shield 3b, the bottom shield 3c, the shield 3d, the shield 3e, and the substrate-surrounding shield 3g are formed separately in the present Example, but may be formed integrally.

Figure 5:
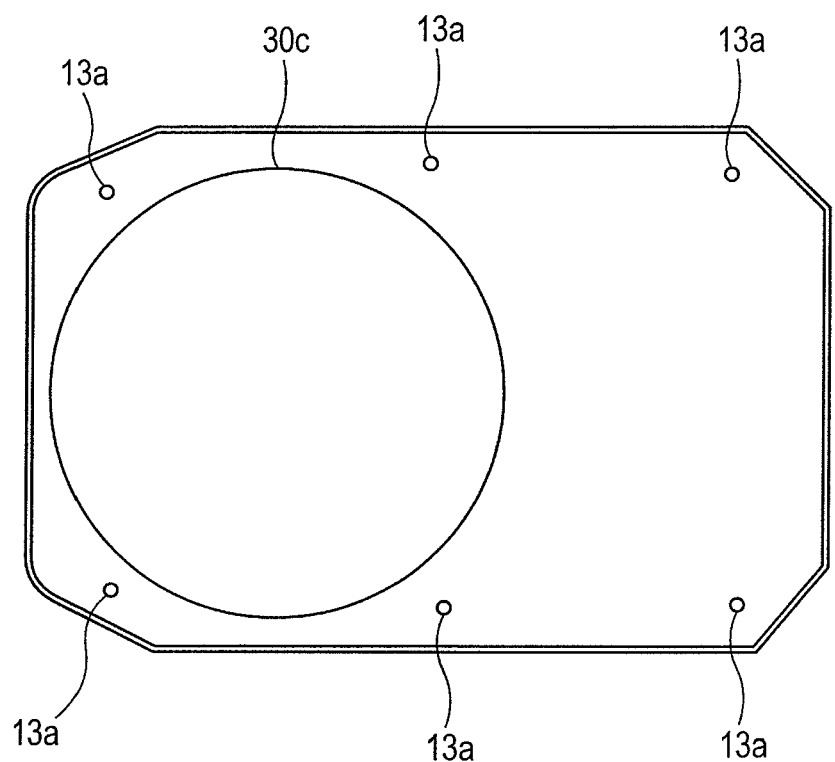
FIG. 5 is a top view of the cross section Y-Y in FIG. 1, seen from the above.

FIG. 5 is a top view of the bottom shield 3c, seeing the cross section Y-Y in FIG. 1 from the above. The bottom shield 3c has a circular opening 30c corresponding to the substrate holder 2. As shown in FIG. 1, the bottom shield 3c is fixed to upper portions of rod-shaped supporters 13 with screws 13a. Moreover, a peripheral edge portion of the circular opening 30c of the bottom shield 3c is provided with the two cylindrical shields 3d, 3e extending downward. Note that these cylindrical shields 3d, 3e each have an I-shaped vertical cross section.

As shown in FIG. 1, the annular shield 3g is provided and fixed around the substrate holder 2. Further, a peripheral edge portion of the annular shield 3g is provided with a cylindrical U-shaped shield 3f. Note that the U-shaped shield 3f has a U-shaped vertical cross section. As the aforementioned I-shaped shield 3e is fitted between U-shaped portions (into a recessed portion) of the U-shaped shield 3f without contact, a labyrinth-like evacuation path 20 is formed. The labyrinth-like evacuation path 20 not only functions as a non-contact seal, but also has a function of preventing target particles from intruding in a direction to the inner wall of the chamber 10.

In the above embodiments, the ceiling 3a attached to the top lid 10a is attached and biased by the fixation bolts 8 and the biasing means 9. However, one member may have the functions of the fixation bolts 8 and the biasing means 9. For example, the ceiling shield 3a may be attached on the top lid 10a by multiple screws, so that when the top lid 10a is closed, the ceiling shield 3a is biased toward the interior side of the chamber. In this case, the multiple screws are both attachment means and biasing means. The ceiling shield 3a is positioned by, for example, providing a guide pin on the top lid 10a and forming a hole on the ceiling shield 3a, through which the guide pin passes.

Furthermore, in the present invention, the opening or closing section of the chamber is referred to as top lid. However, the lid section may be positioned downward relative to the substrate. An aspect of the present invention is to provide a means which bias toward the interior of a chamber provided with a lid relative to a shield provided on the interior side of the chamber.

Hereinabove, the preferred embodiment and Example of the present application have been described with reference to the accompanying drawings. However, the present invention is not limited to such an embodiment and Example, and can be modified into various modes within the technical scope grasped from the description of the scope of claims.

The invention claimed is:

1. A substrate processing apparatus comprising:
   a chamber;
   an openable and closable lid provided on an opening of the chamber;
   a ceiling shield provided on the lid at an interior side of the chamber;
   an attachment means configured to attach the ceiling shield to the lid;
   a side wall shield provided inside the chamber; and
   an elastic member provided between the lid and the ceiling shield,
   wherein, when the lid is in a closed state, the ceiling shield is pushed against the side wall shield by the elastic member to form a continuous shield covering the lid and a side wall of the chamber and, when the lid is in an open state, the ceiling shield and the side wall shield are separated from each other.

2. The substrate processing apparatus according to claim 1, wherein the ceiling shield has an insertion hole, and
   wherein the attachment means comprises:
      an insertion section fixed to the lid while inserted through the insertion hole, and configured to support the ceiling shield in a manner movable within a predetermined distance; and
      a restriction section provided on an end portion of the insertion section and configured to restrict movement of the ceiling shield.

3. The substrate processing apparatus according to claim 1, wherein the lid is provided with a target holder.

4. The substrate processing apparatus according to claim 1, wherein a substrate holder is provided inside the chamber, and the target holder, the substrate holder, the ceiling shield, and the side wall shield form a processing space.

* * * * *